United States Patent [19]

Toussaint et al.

[11] Patent Number: 4,792,997
[45] Date of Patent: Dec. 20, 1988

[54] RECEIVER FOR OPTICAL DIGITAL SIGNALS WITH DARK CURRENT COMPENSATION

[75] Inventors: Hans N. Toussaint; Jan Goerne, both of Munich, Fed. Rep. of Germany

[73] Assignee: Siemens Aktiengesellschaft, Berlin and Munich, Fed. Rep. of Germany

[21] Appl. No.: 62,518

[22] Filed: Jun. 17, 1987

[30] Foreign Application Priority Data

Jun. 23, 1986 [DE] Fed. Rep. of Germany ....... 3620931

[51] Int. Cl.$^4$ ............................................. H04B 9/00
[52] U.S. Cl. .................... 455/619; 455/608; 330/59
[58] Field of Search .............. 455/606–608, 455/617, 619, 600; 330/59, 308; 358/213.16, 213.15; 250/214 A, 214 C

[56] References Cited

U.S. PATENT DOCUMENTS 3,978,343  8/1976  Broderick et al. .................. 250/551
4,293,877  10/1981 Tsunekana ...................... 358/213.16
4,307,469  12/1981 Casper .................................. 455/608
4,403,159  9/1983  Goerne et al. ...................... 307/362
4,484,223  11/1984 Tsunekana ...................... 358/213.16
4,630,121  12/1986 Suzuki et al. .................... 358/213.16
4,724,315  2/1988  Goerne .............................. 455/619

FOREIGN PATENT DOCUMENTS 0052221  3/1986  European Pat. Off. .
2082885  11/1971 France .
197967A  4/1982  Japan ............................. 358/213.16
155712A  7/1986  Japan ............................... 250/214 C

OTHER PUBLICATIONS

IBM Technical Disclosure Bulletin, vol. 21, No. 8, Jan., 1979 "High Sensitivity, Wide Range Photo-Amplifier" by M. Cappa, pp. 3115–3116.
Electronics Letters, vol. 18, No. 23, Nov. 11, 1982 "Transimpedance Optical Preamplifier Having a Common-Collector Front End", pp. 985 and 986.
Japan-58-3335, Mar. 25, 1983, vol. 7, No. 72 (E-166) (1217), "Optical Receiver", Masaru Ikeuchi.
National Semiconductor Corporation-1984 Telecommunications Databook pp. 5-23 "Monolithic TTL Fiber-Optic Receiver".

Primary Examiner—Robert L. Griffin
Assistant Examiner—Leslie Van Beek
Attorney, Agent, or Firm—Hill, Van Santen, Steadman & Simpson

[57] ABSTRACT

A receiver for optical digital signals has a transimpedance amplifier, the input of which is connected to an operating voltage via an active photodiode, and the output of which is connected to an input of a comparator. An operational amplifier is provided, the one input of which is connected to the input of the transimpedance amplifier, and the other input of which is connected to the operating voltage via a further, unilluminated photodiode. A reference voltage at the other input of the comparator is generated from the output voltage of the operational amplifier via a voltage divider.

4 Claims, 1 Drawing Sheet

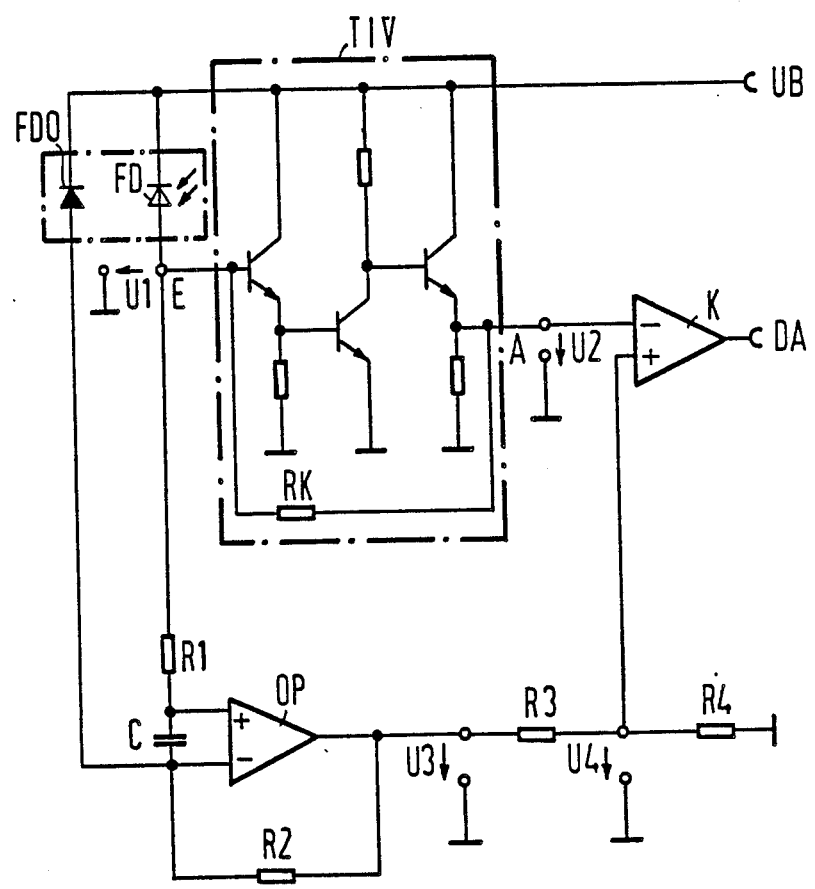

RECEIVER FOR OPTICAL DIGITAL SIGNALS WITH DARK CURRENT COMPENSATION

BACKGROUND OF THE INVENTION

1. Field of the Invention

The invention is related to a receiver for optical digital signals wherein a transimpedance amplifier is provided connected to an output.

2. Description of the Prior Art

Such receivers for optical digital signals usually contain a transimpedance amplifier coupled to a photodiode, and also contain a following comparator which emits voltage pulses in accordance with the received light pulses. For example, the comparator output assumes a logical "1" when the photodiode is illuminated, or vice versa.

European Patent Application No. 0 052 221 discloses a transimpedance amplifier which is constructed as an operational amplifier. For conversion into binary voltage signals, this operational amplifier is followed by a comparator.

The article "Transimpedance Optical Preamplifier Having A Common Collector Front End", printed in Electronics Letters, Vol. 18, No. 23, Nov. 11 1982, discloses a discretely constructed transimpedance amplifier which has three amplifier stages each of which comprises a transistor.

In such dc-coupled receivers for optical digital signals, the switching of the output signal emitted by the comparator is dependent on the absolute value of the current which flows through the photodiode. The comparator can not distinguish whether the current flowing through the photodiode is a photocurrent due to an illumination of the photodiode, or is a dark current of the photodiode which increases due to an increase in temperature.

The dark current of the photodiode, which is within an order of magnitude of 1 to 10 nA at room temperature, increases exponentially with the increase in temperature and reaches values of about 100 nA at 80° C. This means that a receiver already has its function disturbed by such a high photodiode dark current.

It is possible to limit the ambient temperature of the receiver to values at which the dark current of the photodiode is still adequately low.

It is further possible to operate the photodiode with a bias voltage of 0, i.e. no dark current can flow. However, the transmission rate for the optical digital signals is thus limited, and the sensitivity of the photodiode is reduced.

It is also possible to reduce the sensitivity of the receiver to such a degree that the dark current of the photodiode is far lower than the photocurrent required for switching even at the highest occurring ambient temperature.

The "Telecommunications Databook" of National Semiconductor Corporation 1984, pp. 5-23, discloses an optical receiver which comprises two amplifiers each coupled to a photodiode. Only one of the photodiodes is illuminated. The outputs of the amplifiers are connected to a comparator.

SUMMARY OF THE INVENTION

An object of the invention is to specify a receiver for optical digital signals which, given a high input sensitivity, is insensitive to large increases in temperature.

This object is achieved according to the invention by providing an operational amplifier whose one input is connected tto an input of the transimpedance amplifier which also connects to an active photodiode. The other input of this operational amplifier is connected via a further un-illuminated photodiode to the operating voltage to which the transimpedance amplifier is connected. An output of the operational amplifier connects through a voltage divider to a reference input of the comparator which follows the transimpedance amplifier so that a reference voltage is present thereat which compensates for dark current variations.

BRIEF DESCRIPTION OF THE DRAWINGS

The drawing is a schematic diagram illustrating the receiver for optical digital signals which has a dark current compensation according to the invention.

DESCRIPTION OF THE PREFERRED EMBODIMENTS

The drawing figure shows a transimpedance amplifier TIV which comprises three amplifier stages, each of which contains a transistor. The transistors are not referenced in detail. The first transistor is operated in a collector-base circuitry, and an active photodiode FD is inserted into its base-collector input circuit. The first transistor receives increasing base current via its input E over the active photodiode FD when the photodiode FD is illuminated by an optical signal. A first voltage U1 can be obtained at the input E.

The second transistor is operated in an emitter-base circuitry and therefore becomes increasingly conductive in synchronization with the first transistor to whose terminal at the emitter side the base electrode of the second transistor is connected. It becomes increasingly conductive when the intensity of the optical signal influencing the photodiode FD increases.

The third transistor is operated in a collector-base circuitry and has its base electrode connected to a tap at the collector side of the second transistor. A second voltage U2 at a tap at the emitter side of the third transistor is output via an output A as an output voltage of the transimpedance amplifier TIV.

The output A, which is connected to the input E via a feedback resistor RK, is connected to the inverting input of a comparator K.

The input E of the transimpedance amplifier TIV is connected to the non-inverting input of an operational amplifier OP via a first resistor R1. The inverting input of the operational amplifier OP is connected in accordance with the invention, to an operating voltage UB via the anode/cathode path of a further photodiode FDO. This further photodiode FDO is not illuminated and is therefore colored black in the illustration. A capacitor C is connected between the inputs of the operational amplifier OP.

A third voltage U3 can be obtained at the output of the operational amplifier OP which is connected to the inverting input of the operational amplifier OP via a second resistor R2. This third voltage U3 is reduced to a fourth voltage U4 via a voltage divider composed of a third and of a fourth resistor R3, R4. This fourth voltage U4 is present at the non-inverting input of the comparator K from whose data output DA the optical data signals converted into digital voltage signals can be obtained.

Given an increase in the ambient temperature for the photodiode D and for the further photodiode FDO, the dark current of both diodes increases. As a result thereof, both the second voltage U2 at the output A of the transimpedace amplifier TIV as well as the fourth voltage U4 which is present at the comparator K as a reference voltage, rise. The fourth voltage U4 usually lies 50 mV below the second voltage U2. This voltage difference is also preserved given a greater increase in temperature when the two photodiodes FD and FDO exhibit an identical temperature behavior. The sensitivity of the receiver is preserved in this way.

The transimpedance amplifier TIV can also be realized by a fed-back operational amplifier as disclosed in the initially cited European Patent Application.

In a development of the receiver of the invention for optical digital signals, the photodiode FD and the further photodiode FDO have identical dimensions and are accommodated side-by-side on a semiconductor chip. They therefore have approximately the same inhibit current and the same temperature dependency at the same temperature. The two photodiodes FD and FDO can also be integrated in a housing, whereby both chips are electrically contacted, but only the active chips, i.e. the photodiode FD, is illuminated. The further photodiode FDO can be covered by a radiation-impermeable metal layer.

Although various minor changes and modifications might be proposed by those skilled in the art, it will be understood that we wish to include within the claims of the patent warranted hereon all such changes and modifications as reasonably come within our contribution to the art.

We claim as our invention:

1. A receiver for optical digital signals, comprising:
    a transimpedance amplifier having an input connecting to an operating voltage via an active photodiode;
    an output of the transimpedance amplifier connecting to a first input of a comparator;
    an operational amplifier having a first input connected to said transimpedance amplifier input and a second input connected via an un-illuminated photodiode to said operating voltage;
    an output of the operational amplifier connecting through a voltage divider to a second input of said comparator; and
    said comparator connecting to an output whereby fluctuations in dark current occurring in the active photodiode are compensated.

2. A receiver according to claim 1 wherein the active photodiode and un-illuminated photodiode are both integrated in a semiconductor chip and have substantially identical dimensions.

3. A receiver according to claim 1 wherein said un-illuminated photodiode is covered with a radiation-impermeable metallization.

4. A receiver for optical digital signals, comprising:
    a transimpedance amplifier having an input connecting to means for producing signals related to the digital signals;
    an output of the transimpedance amplifier connecting to a first input of a comparator;
    an operational amplifier having a first input connected to said transimpedance amplifier input and a second input connected to a reference photodiode means which is not modulated by said digital signals for producing a reference for dark current;
    an output of the operational amplifier connecting to a second input of said comparator; and
    said comparator connecting to an output.

* * * * *